United States Patent [19]
McDonald et al.

[11] Patent Number: 5,801,560
[45] Date of Patent: Sep. 1, 1998

[54] SYSTEM FOR DETERMINING TIME BETWEEN EVENTS USING A VOLTAGE RAMP GENERATOR

[75] Inventors: Vincent K. McDonald; Jack R. Olson; Barbara J. Sotirin; Robert B. Williams, all of San Diego, Calif.

[73] Assignee: The United States of America as represented by the Secretary of the Navy, Washington, D.C.

[21] Appl. No.: 527,740

[22] Filed: Sep. 13, 1995

[51] Int. Cl.⁶ .................................................. H03K 4/06
[52] U.S. Cl. ........................... 327/134; 327/2; 327/78; 327/91; 377/20
[58] Field of Search ........................ 327/78, 91, 134, 327/2; 377/16, 20

[56] References Cited

U.S. PATENT DOCUMENTS

| | | | |
|---|---|---|---|
| 4,079,315 | 3/1978 | Mohr | 377/20 |
| 4,764,694 | 8/1988 | Winroth | 377/20 |
| 4,908,784 | 3/1990 | Box et al. | 377/20 |
| 5,023,571 | 6/1991 | Fullmer et al. | 327/145 |
| 5,508,649 | 4/1996 | Shay | 327/78 |

*Primary Examiner*—Margaret Rose Wambach
*Attorney, Agent, or Firm*—Harvey Fendelman; Peter A. Lipovsky; Michael A. Kagan

[57] ABSTRACT

A system for determining the time between the receipt of two different signals, includes a voltage ramp generator which generates a time dependent voltage signal upon receipt of a timing pulse at a time $T_1$, and provides the instantaneous value of the voltage signal when the voltage ramp generator receives an input signal having a predetermined threshold value at time $T_2$. A data processor coupled to receive the voltage signal, generates the timing pulse, and determines a time difference $\Delta T$ from the voltage signal, where $\Delta T = T_2 - T_1$.

9 Claims, 5 Drawing Sheets

SYSTEM FOR DETERMINING TIME BETWEEN EVENTS USING A VOLTAGE RAMP GENERATOR

BACKGROUND OF THE INVENTION

The present invention generally relates to the field of signal processing, and more particularly, to a system for determining the time between the receipt of two different signals using a voltage ramp generator.

In the acquisition of particular parameters, for example speed, position, distance or the characteristics of other time dependent functions, a direct measurement of the parameter is often times not feasible. Conventional methods of translating high resolution travel time information require a wide bandwidth and/or high power systems to maintain the required resolution for the time of signal detection. The bandwidth required for a given time resolution t, is 1/t, where t represents time. For example, one millisecond of time resolution generally requires approximately 1 KHz of bandwidth. There are many applications, however, in which the available bandwidth is not sufficient to transfer these signals, without substantial additional complexity and processing in the receiver.

Therefore, a need exists for a system capable of determining the time between events that is more bandwidth efficient than conventional systems.

SUMMARY OF THE INVENTION

The invention provides a method and system for inferring time dependent functions by measuring a time difference, that is, the time between the event of interest and some known reference time. The time difference is translated into an analog voltage which is easily acquired by existing equipment. The system includes a voltage ramp generator which generates a time dependent voltage signal upon receipt of a timing pulse at a time $T_1$, and provides the instantaneous value of the voltage signal when the voltage ramp generator receives an input signal having a predetermined threshold value at time $T_2$. A data processor generates the timing pulse at $T_1$ and is coupled to receive the instantaneous value of the voltage signal. $T_1$ and the voltage signal allow the processor to compute $\Delta T=T_2-T_1$. In a preferred embodiment, the time dependent voltage signal increases in a stair-step, incremental manner, generally referred to as a "ramp" voltage.

Another embodiment of the system provides greater time resolution by generating two stair-step ramp voltage. This system includes a stair-step voltage ramp generator which initiates two time dependent voltage signals upon receipt of a timing pulse at a time $T_1$. The first stair-step ramp voltage provides a coarse time resolution; the second stair-step ramp voltage provides a fine time resolution used to interpolate between stair-step transitions of the first stair-step ramp voltage. The ramp generator provides a voltage signal representing an instantaneous value of the first ramp voltage and a voltage signal representing the instantaneous value of the second ramp voltage when the voltage ramp generator receives an input signal having a predetermined threshold value at time $T_2$. A data processor coupled to receive the voltage signals, generates the initializing timing pulse, and employs both voltage signals to determine a time difference $\Delta T$, where $\Delta T=T_2-T_1$. Arrival of a series of input signals to the voltage ramp generator, having a predetermined threshold value would be received and transmitted the same way. The use of two different voltage ramp signals provides greater time resolution than would use of only one voltage ramp signal.

An important advantage of the present invention is its simplicity, robustness, bandwidth efficiency, and low power requirements. The invention provides a low bandwidth system which is able to generate information that can be used to determine the time between events that is more bandwidth efficient than are prior art systems. These and other advantages of the present invention will become more apparent upon further examination of the following specification, claims, and drawings.

BRIEF DESCRIPTION OF THE DRAWINGS

Throughout the several figures, like elements are AdS referenced using like reference numbers.

DESCRIPTION OF THE PREFERRED EMBODIMENT

The present invention provides a system 10 for determining the time between the receipt of two different signals. The invention may be employed to generate a low bandwidth signal that can be used to determine the time between the receipt of two different signals compared to the bandwidth requirements of a system that determines elapsed time by conventional detection methods. A conventional detector requires a bandwidth of 1/t, whereas, the present invention requires just one (FIG. 1) or two (FIG. 2) DC voltages to provide excellent time difference resolution.

Figure 1:
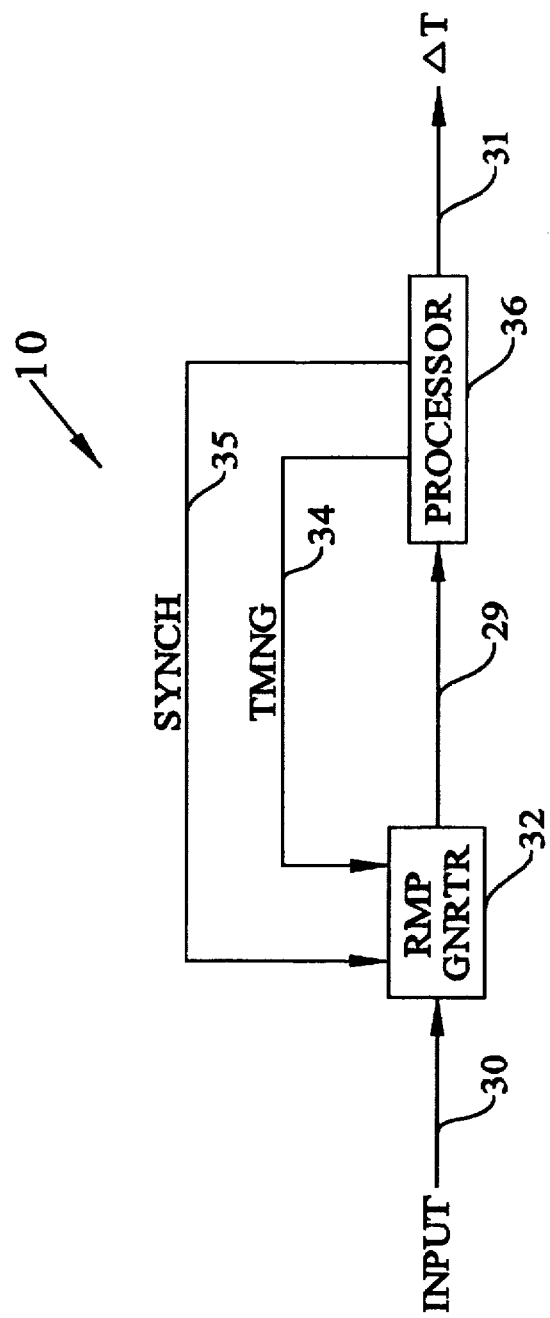
FIG. 1 is a block diagram of a system for determining the time between the receipt of two different signals using a voltage ramp generator embodying various features of the present invention.

Referring now to FIG. 1, there is shown system 10 comprising a ramp generator 32 which commences to internally generate a time dependent voltage ramp signal, $V_C$, in response to receiving each one of a periodic series of timing pulses 34 from a processor 36. The purpose of system 10 is to determine the elapsed time, $\Delta T$, between the receipt by the ramp generator 32 of an input signal 30 having a predetermined threshold value at time $T_2$, and the time, $T_1$, of receipt of the immediately preceding timing pulse 34. Therefore, the relation between $\Delta T$ and the instantaneous value of $V_C$ is a monotone nondecreasing function.

Still referring to FIG. 1, the ramp generator 32 may increase voltage $V_C$ in stair step, discrete increments in synchronism with synchronous (synch) pulses 35, generated by processor 36. The output signal 29 generated by ramp generator 32 is normally at some predetermined level, say for example, 0.0 volts, when the input signal 30 is below a predetermined threshold value. However, when the value of input signal 30 meets or exceeds the threshold at time $T_2$, the ramp generator stores and presents the instantaneous value of $V_C$ as the output signal 29. Data processor 36, which may be a PC clone, employs output signal 29 as an input variable to determine $\Delta T$, which is presented as output signal 31 by the processor 36.

Figure 2:
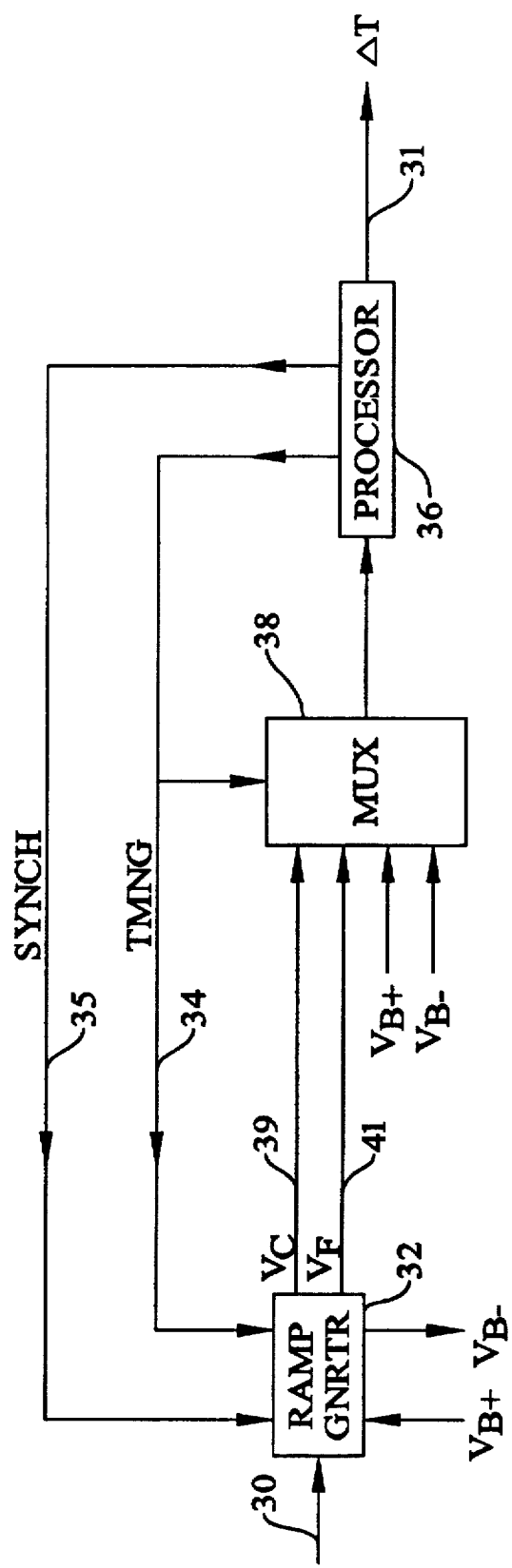
FIG. 2 is a detailed block diagram of another embodiment of the invention.

Referring to FIG. 2, there is shown another embodiment of time determination system 10 which determines the time difference between the receipt of a data signal 30 having a predetermined level and receipt of the immediately preceding timing pulse 35. System 10 comprises a ramp generator 32 which generates time dependent voltage ramp signals $V_C$ and $V_F$ in response to receiving each one of a periodic series of timing pulses 34 provided by processor 36. The instantaneous voltage levels of signals $V_C$ and $V_F$ are used to determine "course" and "fine" time difference resolution, respectively. The values of signals $V_C$ and $V_F$ are ramped to higher voltage levels in synchronism with synchronous (synch) pulses 35, also generated by processor 36.

Figure 5:
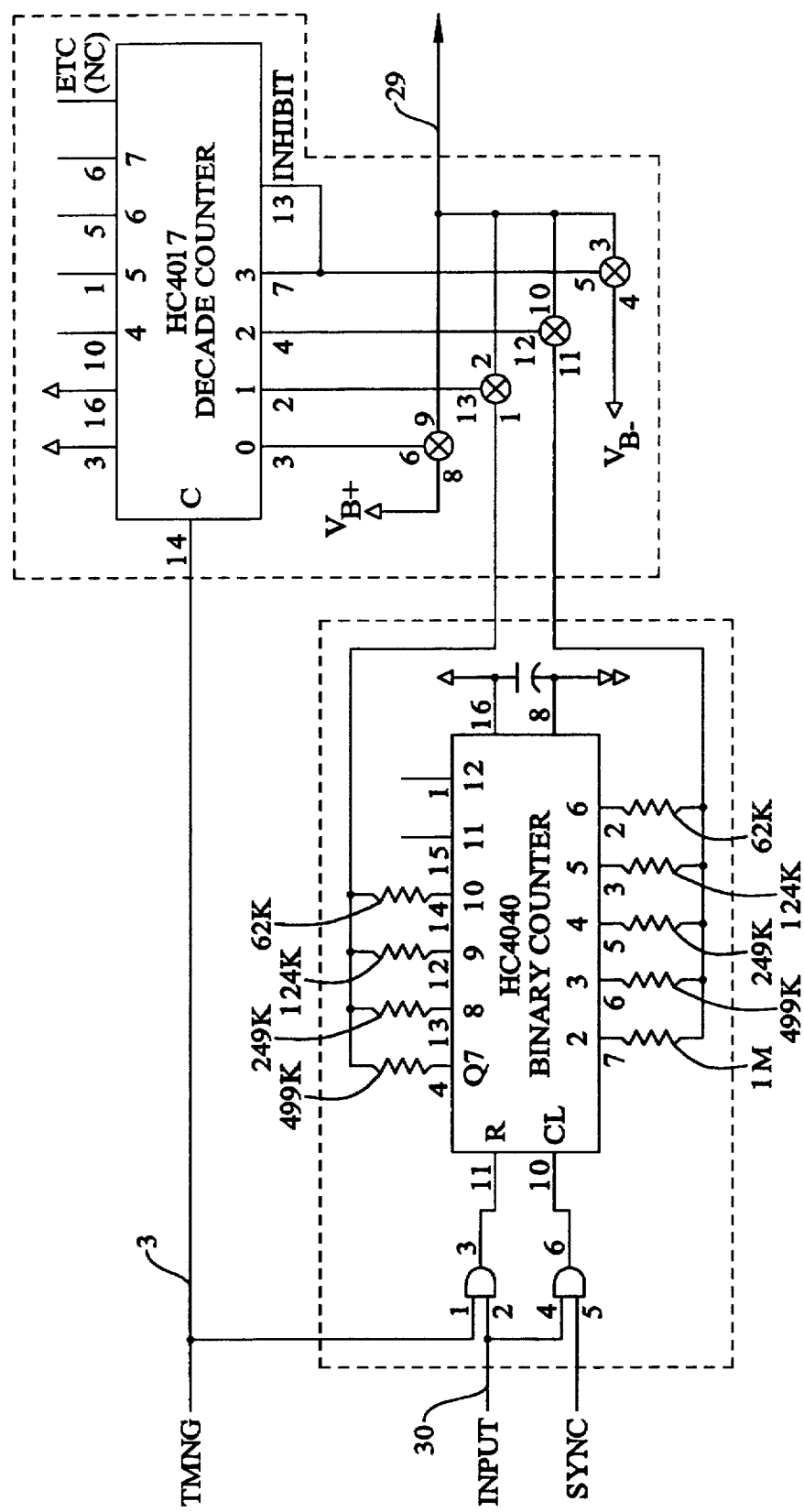
FIG. 5 is a schematic diagram of an example of one particular implementation of the ramp generator 32 and MUX 38.

The instantaneous values of $V_C$ ($V_{Ci}$) and $V_F$ ($V_{Fi}$) are stored by the ramp generator 32 and presented on signal lines 39 and 41, respectively, when the value of input signal 30 exceeds the threshold value. MUX 38 serially outputs the signals presented on signal lines 39 and 41, as well as $V_{B+}$ and $V_{B-}$, to processor 36 in synchronism with receipt of the timing pulses 34. $V_{B+}$ and $V_{B-}$ power ramp generator 32, and may for example, be provided by a battery, not shown. $V_{B+}$ and $V_{B-}$ are used by data processor 36 to determine the slopes of $V_C$ and $V_F$, which change as $V_{B+}$ and $V_{B-}$ change. By way of example, particular implementations of the ramp generator 32 and MUX 38 are presented in FIG. 5. However, the values of the signals presented on signal lines 39 and 41 are zero when the value of input signal 30 is less than a predetermined threshold value, as for example, a logic high.

Processor 36 receives and uses $V_{Ci}$ and $V_{Fi}$ to determine the time difference, $\Delta T$, between receipt of the input signal 30 and the immediately preceding timing pulse 34. System 10 determines $\Delta T$ based simply on the value of one or more voltage levels, and is not required to process high bandwidth data or digital representations of the incoming signals.

Figure 3:
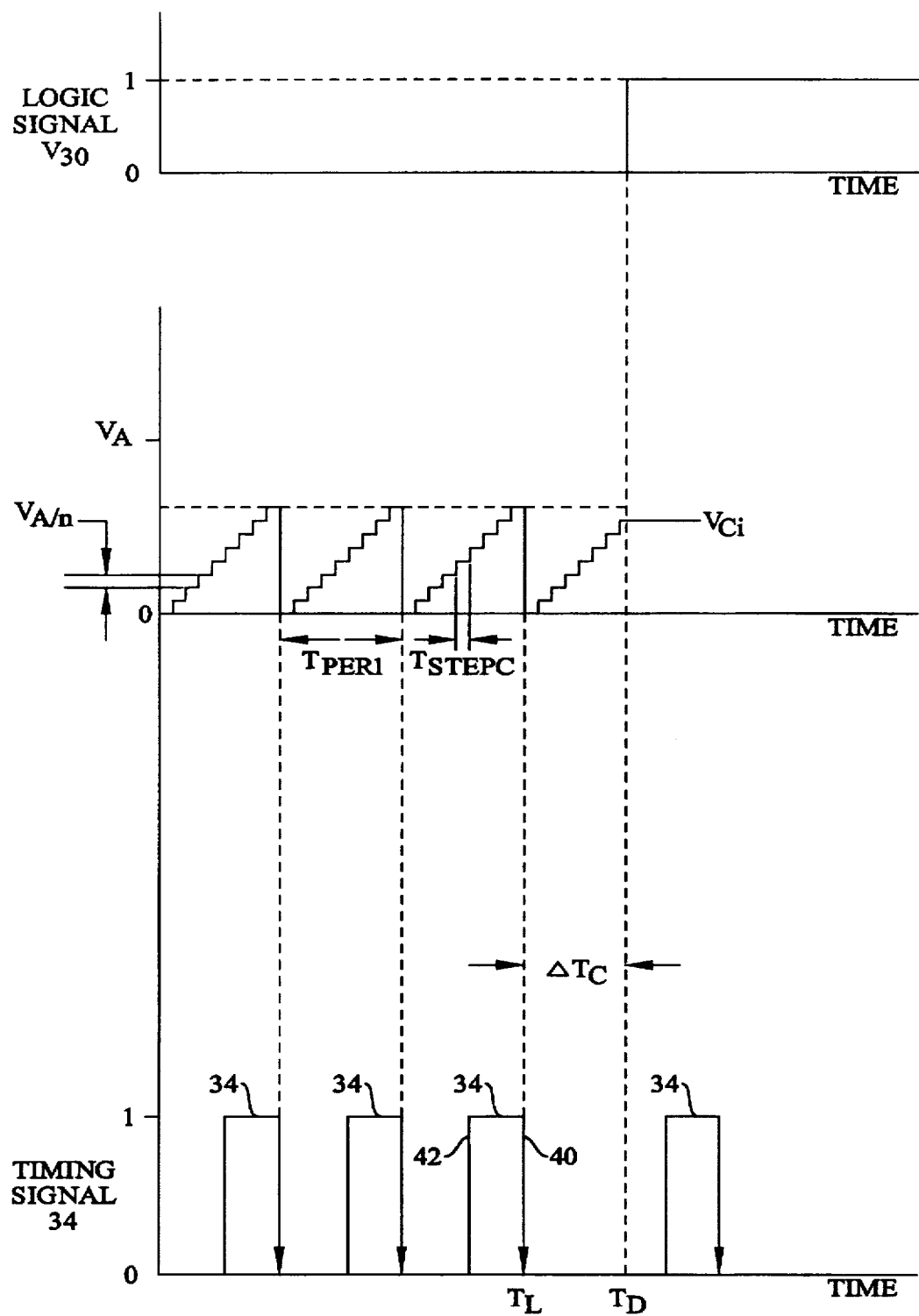
FIG. 3 is a diagram showing the timing relationships between a timing signal, voltage ramp signal, $V_C$, comparator output signal.

Referring now to FIG. 3, the voltage level $V_C$ preferably increases from 0 volts to a suitable voltage level $V_A$ in stair-step voltage increments of $V_A/n$ over a period $T_{PER1}$. The duration of each voltage increment $V_A/n$ is $T_{STEPC}$. $V_{Ci}$ is stored and presented by the ramp generator 32 when at time, $T_D$, data input signal 30 meets or exceeds a threshold level, such as a logic high or "1". A course time difference, $\Delta T_C$, represents the time difference between the time $T_D$ when the signal 30 equals or exceeds the threshold value and, by way of example, the falling edge 40 of the timing pulse 34 immediately preceding $T_D$. More specifically, $\Delta T_C = [V_{Ci}/(V_A/n)-1] \cdot T_{STEPC}$, and $\Delta T_C \approx (T_D-T_L)$. However, it is to be understood that the invention could also be implemented where $T_L$ is represented by the rising edge 42 of the timing pulse 34.

Figure 4:
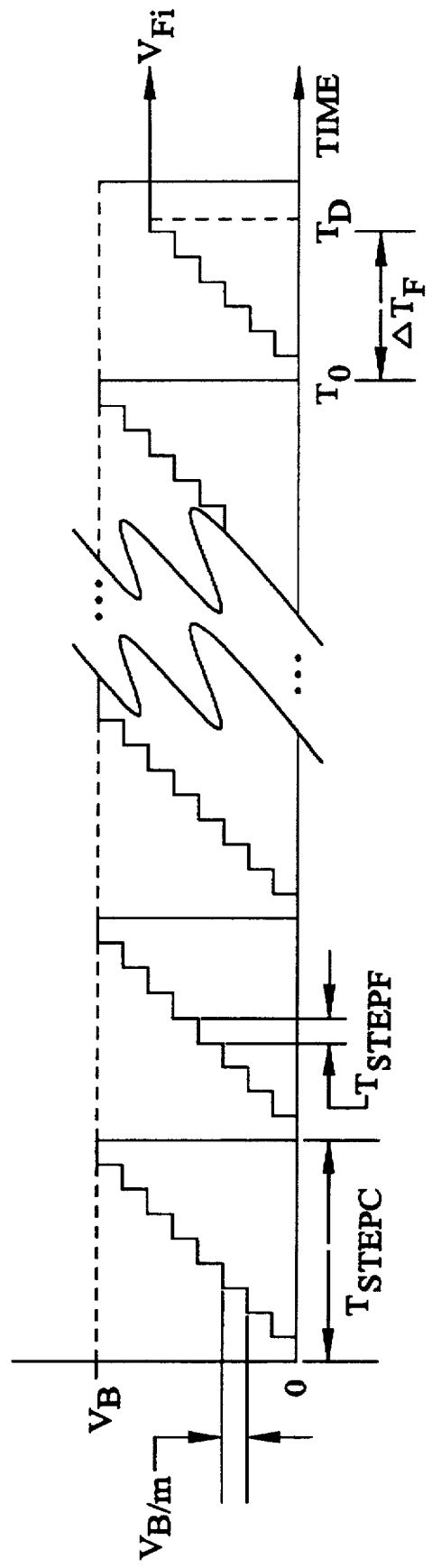
FIG. 4 is a more detailed diagram of the voltage ramp signal, $V_F$.

Voltage ramp signal $V_F$ is employed to provide enhanced time resolution beyond that afforded by $V_C$ alone. Referring now to FIG. 4, the voltage level $V_F$ generally increases from 0 volts to a suitable voltage level $V_B$ in a monotone nondecreasing functional relationship by discrete voltage increments $V_B/m$ in a stair-step pattern over a period $T_{STEPC}$. The duration of each voltage increment $V_B/m$ is $T_{STEPF}$, which corresponds to the period of the synchronous (synch) pulses 35. It should also be noted that $m(T_{STEPF})=T_{STEPC}$. $V_{Fi}$ is the instantaneous voltage at the time, $T_D$, when data input signal 30 attains or exceeds the threshold value. A fine time difference, $\Delta T_F$, then is determined by the processor 36 in accordance with the relation:

$$\Delta T_F = V_{Fi}/(V_B/m) \cdot T_{STEPF}$$

Processor 36 employs $V_{Ci}$ and $V_{Fi}$ to determine $\Delta T$ in accordance with the relation: $\Delta T = \Delta T_F + \Delta T_C$.

Obviously, many modifications and variations of the present invention are possible in light of the above teachings.

For example, $V_C$ and $V_F$ are described as being increased in stair-step increments. However, $V_C$ and $V_F$ could also be generated so as to increase linearly, or in a saw-tooth manner. It is therefore to be understood that within the scope of the appended claims, the invention may be practiced otherwise than as specifically described.

We claim:

1. A system for determining the time between the receipt of two different signals, comprising:

a voltage ramp generator which generates a time dependent voltage ramp signal upon receipt of each one of a series of timing pulses, and provides the instantaneous value of said voltage ramp signal when said voltage ramp generator receives an input signal having a predetermined threshold value; and a data processor for generating said timing pulses at a periodicity $\Gamma$, and using said instantaneous value of said voltage ramp signal to determine a time difference $\Delta T$ between generation of one of said timing pulses at time $T_1$ and receipt of said input signal by said voltage ramp generator at a time $T_2$, where $\Delta T = T_2 - T_1$, and $0 \leq \Delta T \leq \Gamma$.

2. A system for determining the time between the receipt of two different signals, comprising:

a voltage ramp generator which generates a time dependent voltage signal upon receipt of a timing pulse at a time $T_1$, and provides the instantaneous value of said voltage ramp signal when said voltage ramp generator receives an input signal having a predetermined threshold value at time $T_2$; and a data processor coupled to receive said voltage signal, generate said timing pulse, and determine a time difference $\Delta T$ from said voltage signal, where $\Delta T = T_2 - T_1$, wherein the value of said voltage signal is related to $\Delta T$ by a monotone nondecreasing function.

3. The system of claim 2 wherein said value of said voltage ramp signal is restarted and increases linearly in response to said voltage ramp generator receiving each one of said timing pulses.

4. The system of claim 2 wherein the value of said voltage ramp signal is restarted and increases in a stair-step, incremental manner in response to said voltage ramp generator receiving each one of said timing pulses.

5. A system for determining the time between the receipt of two different signals, comprising:

a voltage ramp generator which generates first and second time dependent voltage signals upon receipt of each one of a series of timing pulses, and provides both a third voltage signal representing a first instantaneous value of said first voltage signal and a fourth voltage signal representing a second instantaneous value of said second voltage signal when said voltage ramp generator receives an input signal having a predetermined threshold value; and a data processor for generating said timing pulses at a periodicity $\Gamma$, and employing said third and fourth voltage signals to determine a time difference, $\Delta T$, between generation of one of said timing pulses at a time $T_1$ and receipt of said input signal by said voltage ramp generator at a time $T_2$ where $\Delta T = T_2 - T_1$, and $0 \leq \Delta T \leq \Gamma$.

6. A system for determining the time between the receipt of two different signals, comprising:

a voltage ramp generator which generates first and second time dependent voltage signals upon receipt of a timing pulse at a time $T_1$, and provides both a third voltage signal representing a first instantaneous value of said first voltage signal and a fourth voltage signal representing a second instantaneous value of said second voltage signal when said voltage ramp generator receives an input signal having a predetermined threshold value at time $T_2$;

a data processor coupled to receive said third and fourth voltage signal, generate said timing pulse, and employ said third and fourth voltage signals to determine a time difference $\Delta T$, where $\Delta T = T_2 - T_1$; and a multiplexer which sequentially conveys said third and fourth voltage signals to said data processor.

7. The system of claim 6 wherein said multiplexer sequentially conveys said third and fourth voltage signals to said data processor in synchronism with receipt by said multiplexer of said timing pulse.

8. The system of claim 6 wherein:

said first voltage signal ranges from a first voltage level $V_1$ to a second voltage level $V_2$ over a period $T_{P1}$ in voltage increments $(V_1-V_2)/n$, where each increment has a duration $T_{D1}$, n is a positive integer, and $n(T_{D1}) = T_{P1}$; and said second voltage signal ranges from a third voltage level $V_3$ to a fourth voltage level $V_4$ over said period $T_{P2}$ in voltage increments $(V_4-V_3)/m$, where each increment has a duration $T_{D2}$, m is a positive integer, and $m(T_{D2}) = T_{D1}$.

9. The system of claim 8 wherein said data processor employs said second voltage signal to interpolate time within said period $T_{P1}$.

* * * * *